United States Patent
Krick et al.

(10) Patent No.: US 10,912,175 B2
(45) Date of Patent: Feb. 2, 2021

(54) SYSTEM FOR CONTROLLING THE ELECTRICAL POWER SUPPLY OF A PIXELATED LIGHT SOURCE

(71) Applicant: VALEO VISION, Bobigny (FR)

(72) Inventors: Sebastian Krick, Bobigny (FR); Qingyuan Xie, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/454,287

(22) Filed: Jun. 27, 2019

(65) Prior Publication Data

US 2020/0008281 A1    Jan. 2, 2020

(30) Foreign Application Priority Data

Jun. 28, 2018 (FR) ...................... 18 55882

(51) Int. Cl.
*H05B 45/00* (2020.01)
*B60Q 11/00* (2006.01)
*B60Q 1/26* (2006.01)

(52) U.S. Cl.
CPC .......... *H05B 45/60* (2020.01); *B60Q 11/005* (2013.01); *B60Q 1/26* (2013.01)

(58) Field of Classification Search
None
See application file for complete search history.

(56) References Cited

U.S. PATENT DOCUMENTS

| | | | |
|---|---|---|---|
| 2004/0207532 A1 | 10/2004 | Smithson | |
| 2004/0245946 A1* | 12/2004 | Halter | H05B 45/37 315/312 |
| 2006/0001381 A1* | 1/2006 | Robinson | H05B 45/20 315/185 R |
| 2008/0054390 A1* | 3/2008 | Sloan | H05B 45/24 257/443 |
| 2008/0191631 A1* | 8/2008 | Archenhold | H05B 45/37 315/158 |
| 2010/0259182 A1* | 10/2010 | Man | H05B 45/28 315/250 |
| 2015/0108908 A1 | 4/2015 | Denvir | |
| 2017/0079096 A1 | 3/2017 | Denvir | |
| 2017/0150564 A1 | 5/2017 | Jang et al. | |
| 2018/0070416 A1* | 3/2018 | Kato | H05B 33/0848 |

FOREIGN PATENT DOCUMENTS

CA    2 792 187 A1    4/2014

OTHER PUBLICATIONS

French Preliminary Search Report dated Dec. 21, 2018 in French Application 18 55882 filed on Jun. 28, 2018 (with English Translation of Categories of Cited Documents).

* cited by examiner

*Primary Examiner* — Crystal L Hammond
(74) *Attorney, Agent, or Firm* — Oblon, McClelland, Maier & Neustadt, L.L.P.

(57) ABSTRACT

A device for controlling the electrical power supply of a pixelated light source comprises a converter having a feedback control loop and a microcontroller element. The microcontroller element is arranged to act on the controlled value in a precise manner as a function of at least one parameter of the pixelated light source powered by the converter.

17 Claims, 1 Drawing Sheet

SYSTEM FOR CONTROLLING THE ELECTRICAL POWER SUPPLY OF A PIXELATED LIGHT SOURCE

The invention relates to the field of the electrical power supply of pixelated light sources. In particular, the invention relates to a device for controlling the electrical power supply and for the thermal management of light sources, more particularly of light emitting diodes, LED, or organic light emitting diodes OLED, pixelated or segmented. The invention also relates to a device for a motor vehicle.

Une light emitting diode, LED, is an electronic component capable of emitting light when an electric current passes through it. The light intensity emitted by an LED is in general dependent on the value of the electric current passing through it. Among other things, an LED is characterized by a threshold current value. The threshold value of this forward current ("forward current" being the English term) generally decreases as the temperature rises. Similarly, when an LED emits light, a voltage drop equal to its forward voltage is observed across its terminals. In the motor vehicle field, LED and OLED technology is increasingly used for various light signalling purposes. LEDs are used in order to provide light functions such as daytime running lights, signalling lights, etc. . . . They are exposed to high operating temperatures.

The usefulness of arrays of LEDs, or pixelated light sources, comprising a large number of elementary light emitting light sources is advantageous in many fields of application, and notably in the field of lighting and signalling for motor vehicles. An array of LEDs can for example be used for creating advantageous shapes of light beams for lighting functions such as headlights or daytime running lights. Moreover, several different lighting functions can be produced using a single array, thus reducing the physical dimensions in the restricted space of a motor vehicle lamp. Such an array comprises an assembly of several parallel branches, and each branch comprises a large number of light emitting light sources connected in series. Such a pixelated light source is typically powered with electricity by a voltage source, and each elementary source is associated with a linear current source in order to guarantee homogeneous luminosity. As a large number of elementary light sources is grouped on a very restricted surface, the heat problem is all the greater and it becomes important to control the voltage source accurately and dynamically.

It is known to use a control circuit for controlling an assembly or group of LEDs. Such a circuit makes use of a DC/DC converter in order to convert a DC voltage supplied for example by a motor vehicle battery into a DC load voltage, dependent on the number of LEDs powered. However, for DC/DC converters having a fixed target output voltage, which are inexpensive and consequently used in many applications, the thermal management of LEDs is problematic.

The purpose of the invention is to overcome at least one of the problems raised by the prior art. More precisely, the purpose of the invention is to propose a device for controlling the electrical power supply of a pixelated light source.

According to a first aspect of the invention, a device for controlling the electrical power supply of a pixelated light source is proposed. The device comprises:
a converter intended to convert an electrical input voltage into an electrical load voltage to be supplied to the pixelated light source;
feedback control means of the converter, the feedback control means having as input a value representative of the value of the electrical current flowing in the pixelated light source.

The device is noteworthy in that it comprises a microcontroller element arranged for generating a control signal, of which at least one characteristic depends on at least one parameter of the pixelated light source, and for injecting this signal into the feedback control means.

Preferably, the feedback control means can comprise a voltage divider arranged such that the load voltage is a function of the value of the electric current flowing in the feedback control means.

The at least one parameter of the pixelated light source can preferably comprise an indication of the junction temperature of the pixelated light source. The indication of the junction temperature of the pixelated light source can preferably be obtained by reading the voltage drop across the terminals of a thermistor component, placed close to the pixilated light source, the resistance of which depends on its temperature.

Preferably the microcontroller element can be arranged for generating a first signal of the pulse width modulation, PWM, type, whose cyclic ratio depends on the said parameter and whose average value corresponds to the said control signal.

The amplitude of the first signal can preferably be set to a predefined voltage value by using a voltage shifting circuit.

Preferably, the first signal is connected to a low pass filter circuit in order to generate the said control signal.

According to a second aspect of the invention, a light module for a motor vehicle is proposed. The module comprises a pixelated light source and a device for controlling the electrical power supply of the said pixelated light source. The module is noteworthy in that the device for controlling the electrical power supply is in accordance with the first aspect of the invention.

Preferably, the pixelated light source can comprise a monolithic array of light emitting elements, or a segmented organic light source, OLED.

An independent device for controlling the electric current can preferably be arranged between the control device and the pixelated light source.

Preferably, at least one linear current source can be integrated in the substrate of the said light source.

The pixelated light source can preferably comprise at least one array of light emitting elements (called a "monolithic array" in English terminology) arranged according to at least two columns and at least two rows. Preferably the light emitting source comprises at least one monolithic array of light emitting elements, also called a monolithic array.

In a monolithic array, the light emitting elements are grown from a common substrate and are electrically connected in such a way that they can be activated selectively, individually or in subassemblies of light emitting elements. Thus, each light emitting element or group of light emitting elements can form one of the elementary emitters of the said pixelated light source which can emit light when its material or their material is supplied with electricity.

Different arrangements of light emitting elements can comply with this definition of a monolithic array, provided that the light emitting elements have one of their main elongation dimensions substantially perpendicular to a common substrate and that the spacing between the elementary emitters, formed by one or more light emitting elements grouped together electrically, is small in comparison with the spacings imposed in known arrangements of flat square chips soldered onto a printed circuit board.

The substrate can be made of predominantly semiconductor material. The substrate can comprise one or more other materials, for example non-semiconductor materials. These light emitting elements, having submillimetric dimensions, are for example arranged such that they protrude from the substrate in such a way as to form rods of hexagonal cross-section. The light emitting rods arise from a first face of a substrate. Each light emitting rod, in this case formed by the use of gallium nitride (GaN), extends perpendicularly, or substantially perpendicularly, protruding from the substrate, in this case formed on the basis of silicon, it being possible to use other materials like silicon carbide without departing from the context of the invention. By way of example, the light emitting rods could be made from an alloy of aluminium nitride and gallium nitride (AlGaN), or from an alloy of aluminium phosphide, indium phosphide and gallium phosphide (AlInGaP). Each light emitting rod extends along an axis of elongation defining its height, the base of each rod being disposed in a plane of the upper face of the substrate.

The light emitting rods of a same monolithic array advantageously have the same shape and the same dimensions. They are each delimited by an end face and by a circumferential wall which extends along the axis of elongation of the rod. When the light emitting rods are doped and subjected to a polarisation, the resultant light at the output of the semiconductor source is essentially emitted from the circumferential wall, it being understood that light rays can also leave through the end face. The result of this is that each light emitting rod acts as a single light emitting diode and that the luminance of this source is improved on the one hand by the density of the light emitting rods present and on the other hand by the size of the illuminating surface defined by the circumferential wall and which therefore extends over the whole of the periphery, and the whole of the height, of the rod. The height of a rod can be between 2 and 10 µm, preferably 8 µm; the largest dimension of the end face of a rod is less than 2 µm, preferably less than or equal to 1 µm.

It is understood that, during the formation of the light emitting rods, the height can be modified from one zone of the pixelated light source to another, in such a way as to increase the luminance of the corresponding zone when the average height of the rods forming it is increased. Thus, a group of light emitting rods can have a height, or heights, different from another group of light emitting rods, these two groups being constitutive of the same semiconductor light source comprising light emitting rods having submillimetric dimensions. The shape of the light emitting rods can also vary from one monolithic array to another, notably in the cross-section of the rods and in the shape of the end face. The rods have a generally cylindrical shape, and they can notably have a polygonal, and more particularly hexagonal, cross-sectional shape. It is understood that it is important that the light can be emitted through the circumferential wall and that the latter has a polygonal or circular shape.

Moreover, the end face can have a shape which is substantially flat and perpendicular to the circumferential wall, such that it extends substantially parallel with the upper face of the substrate, or it can have a domed shape or it can be pointed at its centre, in order to multiply the directions of emission of the light leaving the end face.

The light emitting rods can preferably be arranged as a two-dimensional array. This arrangement could be such that the rods are arranged in a staggered manner. In general, the rods are disposed at regular intervals on the substrate and the distance of separation of two immediately adjacent light emitting rods, in each of the dimensions of the array, must at a minimum be equal to 2 µm, preferably between 3 µm and 10 µm, in order that the light emitted by the circumferential wall of each rod can leave the array of light emitting rods. Moreover, provision is made for these separation distances, measured between two axes of elongation of adjacent rods, not to be greater than 100 µm.

Alternatively, the monolithic array can comprise light emitting elements formed by epitaxial layers of light emitting elements, notably a first layer of n-doped GaN and a second layer of p-doped GaN, on a single substrate, for example made of silicon carbide, and which are divided (by grinding and/or ablation) in order to form a plurality of elementary emitters coming from the same substrate. Such a conception results in a plurality of light emitting blocks all coming from the same substrate and electrically connected so that they can be activated selectively with respect to each other.

In one example of embodiment according to this other method, the substrate of the monolithic array can have a thickness of between 100 µm and 800 µm, notably equal to 200 µm; each block can have a length and width, each being between 50 µm and 500 µm, preferably between 100 µm and 200 µm. In one variant, the length and the width are equal. The height of each block is less than 500 µm, preferably less than 300 µm. Finally, the output surface of each block can be formed via the substrate on the side opposite to the epitaxy. The separation distance between two elementary emitters, the distance between each contiguous elementary emitter, can be less than 1 µm, notably less than 500 µm, and it is preferably less than 200 µm.

Alternatively, with light emitting rods extending respectively in protrusion from a same substrate, such as described above, and also with light emitting blocks obtained by division of superimposed light emitting layers on a same substrate, the monolithic array can comprise moreover a layer of a polymer material in which the light emitting elements are at least partially embedded. The layer can thus extend over the whole extent of the substrate or only around a specified group of light emitting elements. The polymer material, which can notably be based on silicone, creates a protective layer which makes it possible to protect the light emitting elements without hampering the diffusion of the light rays. Moreover, it is possible to integrate, in this layer of polymer, wavelength conversion means, and for example luminophores, capable of absorbing at least a portion of the rays emitted by one of the elements and to convert at least a portion of the said absorbed excitation light into an emission light having a different wavelength from that of the excitation light. Indifferently, it will be possible to provide for the luminophores to be embedded in the mass of the polymer material or to be disposed on the surface of that polymer material.

The pixelated light source can comprise moreover a coating of reflective material in order to deflect the light rays towards the output surfaces of the light source.

The light emitting elements having submillimetric dimensions define a specified output surface in a plane substantially parallel with the substrate. It is understood that the shape of this output surface is defined as a function of the number and arrangement of the light emitting elements which compose it. It is thus possible to define a substantially rectangular shape of the emission surface, it being understood that that latter can vary and have any shape whatsoever without departing from the context of the invention.

By using the measures proposed by the embodiments of the present invention, it becomes possible to control in a precise and dynamic manner the output voltage level of a converter having a feedback control loop, in order to adapt it to the requirements of a pixelated light source powered by the converter. The control signal is generated by a microcontroller element which injects it into the feedback control loop. By way of a pulse width modulation signal, a precise discrete value can be generated, by adapting the amplitude of the pulses of the signal and its cyclic ratio within the microcontroller element. The control signal can moreover depend on any parameter of the light source whatsoever. Although in a preferred embodiment this parameter is the temperature of the pixelated light source, which allows the device according to the invention to implement effective management of the light source in question, the invention is not limited to this very precise embodiment.

Other features and advantages of the present invention will be better understood with the help of the description of the examples and of the drawings among which:

Unless specifically indicated otherwise, technical features described in detail for a given embodiment can be combined with the technical features described in the context of other embodiments described as examples and in a non-limiting manner. Similar reference numbers will be used for describing similar concepts throughout different embodiments of the invention. For example, the references 100, 200 and 300 denote three embodiments of a control device according to the invention.

Figure 1:
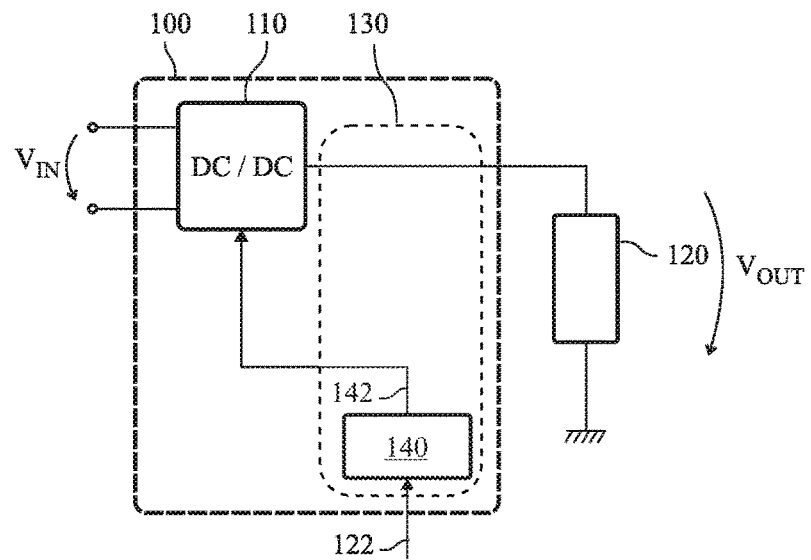
FIG. 1 shows a diagrammatic representation of a control device according to a preferred embodiment of the invention.

The illustration shown in FIG. 1 shows in a diagrammatic manner a device 100 for controlling the electrical power supply according to one embodiment of the invention. The converter 110, which can be a converter of the voltage lowering (or "buck" type) or a voltage raiser (or "Boost") type, or a combination of buck and boost converters, is capable of converting a DC input voltage Vin, supplied by a source which is not shown, into a DC output voltage Vout. The output voltage powers a pixelated light source 120. The light source can for example comprise a monolithic array of light emitting elements, or an organic light source, OLED, having several segments. It is known to current control a converter 110, in order to adapt the voltage level supplied to the circuit connected as a load.

According to the invention, the feedback control means 130 comprise a microcontroller element 140, which has as its input a parameter 122 of the pixelated light source 120. In order to give a concrete example but without however limiting the invention to this example, it can be the temperature of the pixelated light source 122. At its output, the microcontroller generates a control signal 142, dependent on the parameter 122, which is injected into the feedback control loop 130 of the converter 110. Thus, the microcontroller element is capable acting in a precise and dynamic manner on the voltage level Vout supplied by the converter 110, as a function of a parameter of the powered pixelated light source. In the case of temperature, the microcontroller element implements thermal management of the pixelated light source, by acting on the supply voltage as a function of the temperature of the light source. For this purpose, the microcontroller element comprises for example a memory in which the thermal characteristics and the associated behaviour of the light source are pre-recorded. By referring to these data, the control signal 142 is chosen in such a way as to adapt the voltage Vout to the temperature 122.

Figure 2:
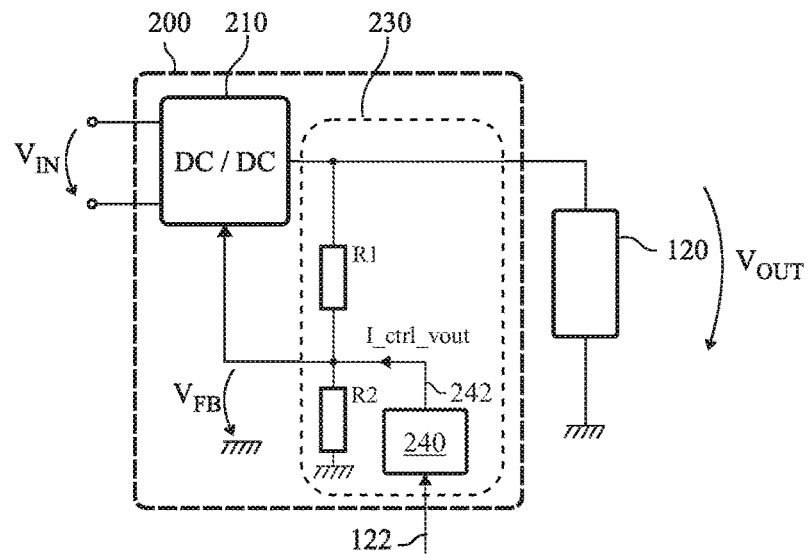
FIG. 2 shows a diagrammatic representation of a control device according to a preferred embodiment of the invention.

The illustration shown in FIG. 2 reuses the general architecture of the preceding embodiment. The feedback control loop 230 comprises moreover a voltage divider bridge produced by the assembly of the resistors R1 and R2 respectively. The voltage VFB applied to the control terminal of the converter 210 is related to the output voltage as follows:

$$Vout = VFB \times \left(1 + \frac{R1}{R22}\right) - \text{I\_ctrl\_vout} \times R1.$$

It becomes clear that the value of the voltage Vout can be directly impacted by introducing a bias in the current I_ctrl_vout, by means of the control signal 242 coming from the microcontroller element 240.

Figure 3:
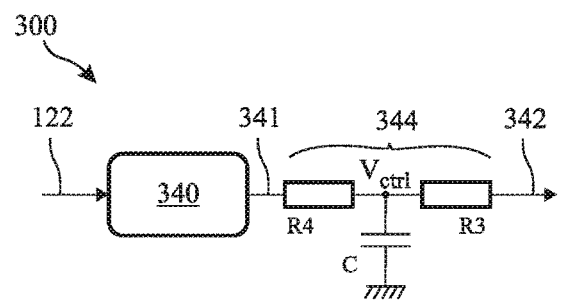
FIG. 3 shows a diagrammatic representation of a detail of a control device according to a preferred embodiment of the invention.

The illustration shown in FIG. 3 shows a preferred embodiment of the generation of the control signal 342. In comparison with the circuit diagram shown in FIG. 2, the microcontroller element 240 is to be replaced by the microcontroller element 340 and the circuit 344. The microcontroller element has as its input a parameter 122 of the pixelated light source and determines, as described above, a corresponding bias value to be injected into the feedback control loop of the converter.

In order to generate this control signal 342 corresponding to the selected bias value in a precise manner, the microcontroller element initially generates a first signal 341 of the PWM type ("PWM" standing for "Pulse Width Modulation"). This discrete periodic signal is principally characterized by its cyclic ratio, i.e. the ratio between the duration of a pulse and the total duration of a period of the cycle. A cyclic ratio of 50% of a unit pulse PWM signal generates a signal having an average value of 0.5 V.

The microcontroller element is adapted to determine the cyclic ratio in a precise manner, which makes it possible to generate a PWM signal having an average value precisely defined between 0 and 1V. It is known to vary such a unit signal to higher voltage pulses. In this way a PWM signal 341 having an average of between 0 and for example 5V can be generated precisely by the microcontroller element. By passing the signal 342 thus generated through a low-pass filter circuit 344, produced for example by the RC circuit comprising the resistors R3, R4 and the capacitor C, the control signal 342 corresponds precisely to the DC component, i.e., the average of the initial PWM signal 341. Formally, the voltage Vctrl shown in FIG. 3 is given by:

$$Vctrl = \frac{R4 \times VFB + R3 \times V_{PWM_{average}}}{R3 + R4},$$

where VPWM average denotes the average value of the PWM signal 341. By choosing R3>>R4, this is reduced to:

$$Vctrl \approx V_{PWM_{average}} + \frac{R4}{R3} \times VFB \approx V_{PWM_{average}}.$$

It should be noted that the electric current I_ctrl_Vout flowing in the feedback control loop is given by $$\text{I\_ctrl\_vout} = \frac{Vctrl - VFB}{R3}.$$

By way of example, if VFB=0.8V, R3=40 kΩ, R4=10 kΩ and C=10 μF, a variation of 1V in the control signal 342, which can be determined precisely, for example using a PWM signal at 1 kHz and with a 1% cyclic ratio, gives a variation of 0.1 V in the load voltage Vout provided by the converter 110.

The extent of the protection is defined by the following claims.

The invention claimed is:

1. A device for controlling the electrical power supply of a pixelated light source, the device comprising:
   a converter to convert an electrical input voltage into an electrical load voltage to be supplied to the pixelated light source; and
   feedback control means of the converter, the feedback control means having as input a value representative of a value of the electrical current flowing in the pixelated light source,
   the feedback control means further including:
   (i) a microcontroller element configured to generate a control signal based on at least one parameter of the pixelated light source, the control signal injected into a feedback control loop between the converted and the pixelated light source, and
   (ii) a voltage divider having an input connected to the microcontroller element and an output connected to the converter, the voltage divider arranged such that the load voltage is a function of the value of the electric current flowing in the feedback control means,
   wherein the at least one parameter of the pixelated light source comprises an indication of a junction temperature of the pixelated light source.

2. The device according to claim 1, wherein the microcontroller element is configured to generate a first signal of a pulse width modulation (PWM) type having a cyclic ratio that depends on the at least one parameter and having an average value that corresponds to the control signal.

3. The device according to claim 2, wherein the amplitude of the first signal is set to a predefined voltage value by using a voltage shifting circuit.

4. The device according to claim 3, wherein the first signal is connected to a low pass filter circuit in order to generate the control signal.

5. A light module for a motor vehicle includes a pixelated light source and a device for controlling the electrical power supply of the pixelated light source, wherein the device for controlling the electrical power supply is according to claim 3.

6. The device according to claim 2, wherein the first signal is connected to a low pass filter circuit in order to generate the control signal.

7. A light module for a motor vehicle includes a pixelated light source and a device for controlling the electrical power supply of the pixelated light source, wherein the device for controlling the electrical power supply is according to claim 6.

8. A light module for a motor vehicle includes a pixelated light source and a device for controlling the electrical power supply of the pixelated light source, wherein the device for controlling the electrical power supply is according to claim 2.

9. A light module for a motor vehicle includes a pixelated light source and a device for controlling the electrical power supply of the pixelated light source, wherein the device for controlling the electrical power supply is according to claim 1.

10. The light module according to claim 9, wherein the pixelated light source comprises a monolithic array of light emitting elements, or a segmented organic light source, OLED.

11. The light module according to claim 10, wherein an independent device for controlling the electric current is arranged between the control device and the pixelated light source.

12. The light module according to claim 10, wherein at least one linear current source is integrated in the substrate of the light source.

13. The light module according to claim 9, wherein an independent device for controlling the electric current is arranged between the control device and the pixelated light source.

14. The light module according to claim 13, wherein at least one linear current source is integrated in the substrate of the light source.

15. The light module according to claim 9, wherein at least one linear current source is integrated in the substrate of the light source.

16. The device of claim 1, wherein the junction temperature is measured by detection of a voltage drop across terminals of a thermistor component placed in a vicinity of the pixelated light source.

17. The device according to claim 1, wherein the pixelated light source comprises a segmented organic light source (OLED).

* * * * *